United States Patent [19]
Wudl et al.

[11] Patent Number: 5,679,757
[45] Date of Patent: Oct. 21, 1997

[54] HIGHLY ORGANIC SOLVENT SOLUBLE, WATER INSOLUBLE ELECTROLUMINESCENT POLYPHENYLENE VINYLENES HAVING PENDANT STEROID GROUPS AND PRODUCTS AND USES THEREOF

[75] Inventors: Fred Wudl, Santa Barbara, Calif.; Sigurd Hoger, Mulheim an der Ruhr, Germany

[73] Assignee: The Regents of the University of California, Oakland, Calif.

[21] Appl. No.: 28,675

[22] Filed: Mar. 8, 1993

Related U.S. Application Data

[60] Continuation-in-part of Ser. No. 19,778, Feb. 19, 1993, which is a division of Ser. No. 626,463, Dec. 12, 1990, Pat. No. 5,189,136.

[51] Int. Cl.$^6$ ................................................ C08G 61/02
[52] U.S. Cl. ........................... 528/86; 313/498; 528/97; 528/99
[58] Field of Search ..................... 528/86, 97, 99, 528/206, 210

[56]  References Cited

U.S. PATENT DOCUMENTS

| | | | |
|---|---|---|---|
| 4,946,937 | 8/1990 | Heitz | 528/392 |
| 5,185,100 | 2/1993 | Han | 252/500 |
| 5,189,136 | 2/1993 | Wudl | 528/86 |

*Primary Examiner*—Christopher Henderson
*Attorney, Agent, or Firm*—Burns, Doane, Swecker & Mathis, L.L.P.

[57]  ABSTRACT

Novel soluble, fast doping and de-doping, conductive, electroluminescent π-conjugated homo- and co-polymers comprise poly(phenylene vinylene) polymers of the chemical formula

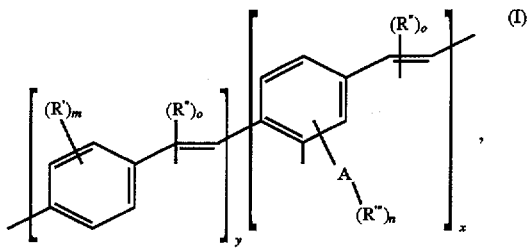

wherein R' is the same or different and is selected from the group consisting of hydrogen, ($C_1$–$C_{10}$)alkyl, alkenyl, and alkynyl, ($C_6$–$C_{30}$)aryl, cycloalkyl, cycloalkenyl and cycloalkynyl, ($C_7$–$C_{40}$)arylalkyl, arylalkenyl, arylalkynyl, alkyl, alkenyl and alkynyl cycloalkyl, alkyl, alkenyl, and alkynyl cycloalkenyl, and alkyl, alkenyl and alkynyl cycloalkynyl, —OR''' and combinations thereof, wherein R''' is selected from the group consisting of ($C_6$–$C_{30}$) hydrocarbons comprising branched alkyl, alkenyl, alkynyl, cycloalkyl, cycloalkenyl and cycloalkynyl, mono- and poly-hydroxylated derivatives thereof, ($C_1$–$C_{10}$)esters and ethers thereof, and ($C_5$–$C_{30}$)carbohydrates comprising furanosyl, pyranosyl, and oligomers thereof, ($C_1$–$C_{10}$)ethers and esters thereof, and combinations thereof, R'' is hydrogen or methyl, A is O,C,S, N or a single bond, n is 1 to 4, m is 1 to 4, o is 1 to 2, x>1, y>0, and x+y>20. These polymers are useful in the manufacture of electrostatic and electromagnetic interference shields, molded articles, and especially in electroluminescent layers, films and fibers for use in light-emitting diodes (LEDs) for technical devices. A method for sensing a dopant within a designated area comprises exposing an amount of a dopant present within a designated area to at least one poly(phenylene vinylene) polymer of this invention for a period of time effective to allow the uptake of the dopant to be sensed by the polymer; and measuring the conductivity of the polymer and correlating the conductivity to the amount of dopant present within the designated area. An improved method of transducing electric energy into visible light by means of a light-emitting diode (LED) comprising a metallic contact, an electron transport layer and a semiconductive layer, the improvement wherein the semiconductive layer is formed from the polymer of the invention.

8 Claims, No Drawings

HIGHLY ORGANIC SOLVENT SOLUBLE, WATER INSOLUBLE ELECTROLUMINESCENT POLYPHENYLENE VINYLENES HAVING PENDANT STEROID GROUPS AND PRODUCTS AND USES THEREOF

This application is a continuation-in-part of U.S. Ser. No. 08/019,778, filed Feb. 19, 1993, which in turn is a divisional of U.S. Ser. No. 07/626,463, filed Dec. 12, 1990, now U.S. Pat. No. 5,189,136.

This invention was made with Government support under NSF Grant No. DMR91-00033, the Government may have certain rights in this invention.

BACKGROUND OF THE INVENTION

1. Field of the Invention

This invention relates to the field of luminescent conductive polymers and to light emitting devices (LEDs) prepared by spinning a polymer film from solution at room temperature without subsequent treatment or heating. More particularly, this invention relates to π-conjugated semiconducting polymers such as poly(phenylene vinylenes) with large substituents such as poly[2,5-bis(cholestanoxy)-p-phenylene vinylene (BCHA-PPV), and poly[2,5-bis(2'-ethyl hexyloxy)-p-phenylene vinylene] (BEH-PPV), which are soluble in common organic solvents, and become conducting polymers after oxidative doping. These polymers are useful for the manufacture of shaped articles such as parts, fibers, tapes, rods and films.

2. Description of the Background

The advent of conducting polymers in the late 1970s opened the possibility of combining the electronic and optical properties of semiconductors and metals with the mechanical properties and processing advantages of polymers. Initial efforts to this end were discouraging since the new conducting polymers exhibited several undesirable properties including, among others, insolubility, intractability, and relatively poor mechanical properties. Moreover, these early polymers were non-melting.

More recently, specific π-conjugated polymer systems have been rendered more soluble and processable. For example, the poly(3-alkylthiophene) derivatives (P3ATs) of polythiophene are soluble and meltable with alkyl chains of sufficient length, and have been processed into films and fibers. Due to the moderate molecular weights and/or the molecular structures of these polymers, however, their mechanical properties, particularly the modulus and tensile strength of the fibers and films made from these polymers are inadequate to enable their use in many applications.

Alternative methods of processing conductive polymers were then developed to permit the manufacture of films and other products. For example, poly(phenylene vinylene) (PPV), and alkoxy derivatives of PPV were synthesized via a precursor polymer route. According to the precursor polymer route, a saturated precursor polymer is first synthesized, which is soluble and can be processed into the desired final shape. In the final step, the precursor polymer is thermally converted to the conjugated polymer. Although the precursor polymer route is advantageous, the multi-step synthesis is complex and, consequently, the resultant materials are relatively expensive. This limits their applications.

Other efforts have been directed to the development of PPV polymers which are soluble in the final conjugated form. Poly(dihexyloxy phenylene vinylene) (DHO-PPV) is not soluble in common organic solvents at room temperature but is soluble at temperatures above 80° C. The longer side-chain octyloxy derivative DOO-PPV was found to be less soluble in most non-polar solvents, probably because of side chain interdigitation and "side chain crystallization".

The use of the above, described conjugated polymers for oxidative doping is severely limited because of their limited solubility and inferior mechanical properties.

U.S. Pat. No. 5,189,136 by some of the present inventors discloses π-conjugated PPV that are partially soluble in common aqueous and organic solvents and possess fast doping and de-doping characteristics. Those polymers also possess electrochromic and semiconductor properties and the ability to form thixotropic solutions. One such polymer is poly[2-methoxy-5-(2'-ethyloxy)-p-phenylene vinylene] (MEH-PPV). MEH-PPV may be processed into shaped articles, films, fibers, and the like. MEH-PPV, however, is only partially soluble at room temperature and its solutions are unstable and form gels at room temperature. Thus, solution casting of uniform films from MEH-PPV is difficult, requires high experimental skills and is therefore uneconomical.

Conjugated polymers have been used to produce organic light emitting diodes (LEDs). The first LED using conjugated polymers was made from unsubstituted PPV and produced light of a green-yellow color (Burn, P. L., et al., J. Chem. Soc. Chem. Commun. 32, (1992)). Shortly thereafter, some of the present inventors produced a red-orange emitting LED from MEH-PPV (Braun, D. and Heeger, A. J., Appl. Phys. Lett. 58:1982 (1991)). MEH-PPV, however, is not free of problems. The polymer is partially soluble at ambient temperature when the molecular weight is not extremely high. However, the more desirable higher molecular materials remain insoluble at room temperature and are therefore difficult to process into films and the like suitable for use in LEDs.

Semiconducting and luminescent π-conjugated polymers offer a number of significant advantages over conventional inorganic semiconductors for LED applications. These polymers permit the alteration of the π—π* energy gap through controlled changes in the molecular structure. These polymers also permit the manufacture of LED structures by casting the active luminescent polymer layer from solution, which provides a significant manufacturing advantage. Finally, these polymers permit the construction of "plastic" LEDs, which enables the fabrication of flexible light sources in a variety of unusual shapes which was not possible before.

Initial results from such polymer LEDs have demonstrated that light emission within the visible spectrum can be realized with efficiency, brightness and uniformity. Flexible LEDs may be produced by spin-casting from solution the hole injecting polymer electrode and the semiconducting luminescent polymer layer onto a transparent polymer substrate. Polymer LEDs have been manufactured with on and off transients in the 10–50 nanosecond regime because switching on and off is RC limited. This fast response and the linearity of the light output make pulsed operation and multiplexing possible.

Although there has been progress in the development of polymer LEDs, the number of π-conjugated polymers with good solubility and relatively high luminescence efficiency is still limited. The principal example of soluble π-conjugated polymers of high efficiency is MEH-PPV. As already indicated, MEH-PPV is soluble at elevated temperatures but its solutions are unstable and form gels at room temperature. Thus, solution casting of uniform films of MEH-PPV is difficult and requires special care.

Accordingly, the synthesis of highly soluble, π-conjugated polymers for the realization of high efficiency polymer LEDs has remained an important goal.

SUMMARY OF THE INVENTION

This invention relates to a soluble, fast doping and de-doping, conjugated, electroluminescent poly(phenylene vinylene) polymer of the chemical formula

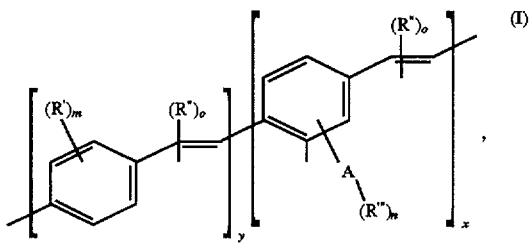

wherein

R' is the same or different and is selected from the group consisting of hydrogen, ($C_1$–$C_{10}$)alkyl, alkenyl, and alkynyl, ($C_6$–$C_{30}$) aryl, cycloalkyl, cycloalkenyl and cycloalkynyl, ($C_7$–$C_{40}$)arylalkyl, arylalkenyl, arylalkynyl, alkyl, alkenyl and alkynyl cycloalkyl, alkyl, alkenyl, and alkynyl cycloalkenyl, and alkyl, alkenyl and alkynyl cycloalkynyl, —OR''', and combinations thereof, wherein R'' is the same or different and is selected from the group consisting of hydrogen and methyl;

R''' is the same or different and is selected from the group consisting of ($C_6$–$C_{30}$)hydrocarbons comprising branched alkyl, alkenyl, alkynyl, cycloalkyl, cycloalkenyl and cycloalkynyl, mono- and poly-hydroxylated derivatives thereof, ($C_1$–$C_{10}$)esters and ethers thereof, and ($C_5$–$C_{30}$) carbohydrates comprising furanosyl, pyranosyl, and oligomers thereof, ($C_1$–$C_{10}$)ethers and esters thereof, and combinations thereof;

A is selected from the group consisting of O, S, N, C and a single bond;

m is 1 to 4;
n is 1 to 4;
o is 1 to 2;
x is equal to or greater than 1;
y is equal to or greater than 0; and
x+y is greater than about 20.

Examples of poly(phenylene vinylene) polymers are poly [2,5-bis(cholestanoxy)-p-phenylene vinylene (BCHA-PPV), and poly[2,5-bis(2'-ethyl-hexyloxy)-p-phenylene vinylene] (BEH-PPV).

This invention also provides a solution comprising at least one poly(phenylene vinylene) polymer of the chemical formula (I) shown above, and at least one solvent. At high concentrations of the polymer, where R''' is derived from a liquid crystal forming mesogen the solution exhibits liquid crystalline characteristics.

In addition, an electrically conductive material formed from at least one of the homo- or co-polymers of the invention is also encompassed herein.

Also part of this invention are shaped articles such as parts, fibers, tapes, films, and the like, formed from the polymer of the invention. Films can be spin-cast on surfaces, such as poymer films, quartz, glass and indium-tin oxide coated glass (ITO), from a solution of the polymer of the invention.

The poly(phenylene vinylene) polymers of the invention are useful in applications such as nonlinear optics, electrostatic shielding, electromagnetic interference shielding, and the like. Thus, the polymer of the invention may be utilized in the manufacture of, for instance, the active luminescent semiconductive layer of a light-emitting diode (LED), electrostatic or electromagnetic interference shields, and the like.

Still another part of this invention is a method for sensing the presence of a dopant within a designated area, comprising exposing an amount of a dopant present within a designated area to at least one poly(phenylene vinylene) polymer of the invention for a period of time effective to allow the uptake of the dopant to be sensed by the polymer; and measuring the conductivity of the polymer and correlating the conductivity to the amount of dopant the designated area.

Also provided herein is an improved method of transducing electric energy into visible light by means of a LED comprising a metallic contact, an electron transport layer and a semiconductive layer, the improvement comprising a semiconductive layer formed from the polymer of this invention.

Other objects, advantages and features of the present invention will become apparent to those skilled in the art from the following discussion.

DESCRIPTION OF THE PREFERRED EMBODIMENTS

This invention arose from a desire by the inventors to improve on prior art technology encompassing π-conjugated poly(phenylene vinylenes) having conductive and doping and de-doping characteristics. Prior art polymers of this type have limited solubility at room temperature, and their solutions are unstable and form gels at room temperature. These drawbacks limit the use of the prior art polymers since it is difficult and highly uneconomical to manufacture uniform films of the polymers by solution casting.

The present patent provides novel π-conjugated homo- and co-poly(phenylene vinylene) random and block polymers that are highly soluble at room temperature in a variety of solvents regardless of their molecular weight. The polymers of the invention are also fast doping and de-doping, conductive and electroluminescent and produce high quantum efficiency LEDs.

This invention therefore provides a soluble, fast doping and de-doping, conjugated, electroluminescent poly (phenylene vinylene) polymer of the chemical formula

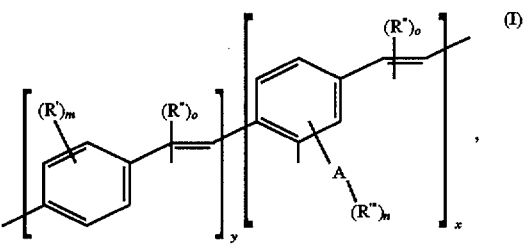

wherein

R' is the same or different and is selected from the group consisting of hydrogen, ($C_1$–$C_{10}$)alkyl, alkenyl, and alkynyl, ($C_6$–$C_{30}$)aryl, cycloalkyl, cycloalkenyl and cycloalkynyl, ($C_7$–$C_{40}$)arylalkyl, arylalkenyl, arylalkynyl, alkyl, alkenyl and alkynyl cycloalkyl, alkyl, alkenyl, and alkynyl cycloalkenyl, and alkyl, alkenyl and alkynyl cycloalkynyl, —OR''', and combinations thereof, wherein R'' is the same or different and is selected from the group consisting of hydrogen, and methyl;

R''' is the same or different and is selected from the group consisting of ($C_6$–$C_{30}$)hydrocarbons comprising branched alkyl, alkenyl, alkynyl, cycloalkyl, cycloalkenyl and cycloalkynyl, mono- and poly-hydroxylated derivatives thereof, ($C_1$–$C_{10}$)esters and ethers thereof, and ($C_5$–$C_{30}$) carbohydrates comprising furanosyl, pyranosyl, and oligomers thereof, ($C_1$–$C_{10}$)ethers and esters thereof, and combinations thereof;

A is selected from the group consisting of O, S, N, C and a single bond;

m is 1 to 4;

n is 1 to 4;

o is 1 to 2;

x is equal to or greater than 1;

y is equal to or greater than 0; and x+y is greater than about 20.

As can be seen from the chemical formula (I), the polymers may be homo-polymers or co-polymers. Suitable R' substituents are hydrogen, and ($C_1$–$C_{10}$)alkyl, alkenyl and alkynyl, and combinations thereof. Another group of suitable R' substituents are ($C_6$–$C_{30}$)aryl, cycloalkyl, cycloalkenyl, cycloalkynyl, and combinations thereof, which may be substituted. Still another preferred group are those where R' is ($C_7$–$C_{40}$)arylalkyl, arylalkenyl, and arylalkynyl, and alkylcycloalkyl, alkylcycloalkenyl, and alkylcycloalkynyl, alkenylcycloalkyl, alkenylcycloalkenyl and alkenylcycloalkynyl and alkynylcycloalkyl, alkynylcycloalkenyl and alkynylcycloalkynyl and combinations thereof. All these moieties may be further substituted with hydroxyl, ether, ester, halogen such as F, Cl, Br or I, and the like.

The co-polymers may be random or block co-polymers and comprise more than about 20 units of the poly (phenylene vinylene) up to about one hundred thousand units, and more preferably about 50 to 50,000 and even more preferably about 100 to 20,000 units. However, when R' is hydrogen, y should not exceed about five. High molecular weight polymers are preferred for producing uniform, high quality films. In general x+y is 20 to 100,000, more preferably 50 to 50,000, and even more preferably 100 to 20,000, which is equivalent to 1>x/x+y>0.05, more preferably 1>x/x+y>0.07, and even more preferably 1>x/x+y>0.1.

At least one R'" substituent, however, must be chiral in order for the polymer to be optically active. Moreover, when both substituents of a ring are chiral, both must have the same chirality. In one preferred embodiment, the polymer is a homopoly(phenylene vinylene) polymer of the chemical formula (I), wherein y is 0 and x is about 20 to 100,000, and more preferably about 100 to 20,000. In another preferred embodiment, the polymer is a co-poly(phenylene vinylene) polymer, wherein the ratio of x:y is at least about 1:20 (1>x/x+y>0.05 to 1), and more preferably about 1:10 (1>x/x+y>0.07), and still more preferably about 1:5 (1>x/x+y>0.1). Still another preferred emboidment comprises a random co-polymer.

The substituent R'" is suitably a hydrocarbon such as branched ($C_6$–$C_{30}$)alkyl, alkenyl and alkynyl, ($C_6$–$C_{30}$) cycloalkyl, cycloalkenyl and cycloalkynyl, and mono- and poly-hydroxylated derivatives thereof. Preferred R'" subtituents are highly branched hydrocarbons attached to the phenyl ring by an O-atom and mono- and poly-hydroxylated derivatives thereof. Also preferred are ester and ethers of these compounds and combinations thereof. Another group of suitable R'" substituents are carbohydrate residues such as furanosyl, pyranosyl, and oligomers thereof of up to about 3 units, and more preferably up to about 2 units. Another preferred group is that of ethers and esters of these subtituents and combinations thereof. Particularly preferred are R'" substituents such as steroids, terpenes, and amide, halogen, hydroxyl, ester and ether derivatives thereof. Examples of steroids are cholesterol, cholestanol and other naturally occurring steroids, cedrol, menthol, farnesol, vitamin $D_3$, ergosterol, and the like. Examples of terpenes are regular terpenes, di-terpenes and sesqui-terpenes among others.

Preferred homo-polymers in general are those where x is about 20 to 100,000, and even more preferred those where x is 50 to 50,000.

Suitable carbohydrates are glucose, mannose, xylose, and galactose, among others. However, other carbohydrates and 2 to 3-unit oligomers thereof are also suitable, and more preferably about 2-unit oligomers thereof. The polyhydroxylated derivatives are typically more soluble in polar solvents and increase the manufacturing capability. Thus, highly derivatized, and preferably hydroxylated, esterified and etherified derivatives thereof are also preferred.

Particularly preferred homo- and co-polymers are those wherein R'" is cholestanoxy, and asymmetric derivatives thereof.

The chemical formula of this polymer is shown below.

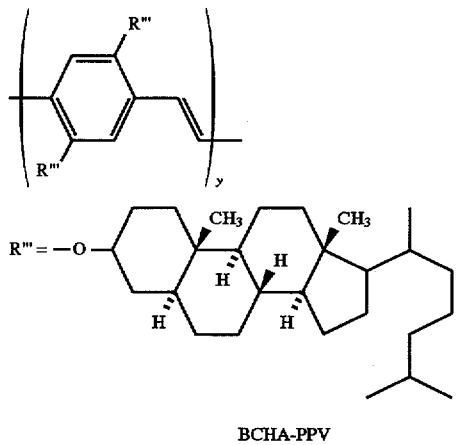

BCHA-PPV

Also preferred are homo- and random and block co-polymers where R'" is 2'-ethylhexyloxy and asymmetric derivatives thereof.

Also provided herein is a solution comprising at least one homo- and/or co-polymer or the invention, and at least one solvent. The proportion of polymer to solvent is broad, typically about 0.01 to 50%, and preferably about 0.05 to 25%, and more preferably about 1 to 10%. However, other amounts are also contemplated. When the R'" substituent of the polymer is a carbohydrate or an oligomer thereof, or a polyhydroxylated hydrocarbon, or ethers or esters thereof, or combinations thereof, the solvents may typically be water and/or aqueous mixtures with highly polar solvents. Solutions of greater than about 2% polymer, where R'" is derived from a liquid crystal forming mesogen have been shown to produce a liquid crystalline phase.

Highly polar solvents as defined herein are those having a dielectric constant equal to or greater than about 20, and more preferably equal to and greater than about 25. Typically, polar solvents are ($C_1$–$C_6$)alcohols, acetonitrile, cyclocarbonates and di($C_1$–$C_6$)alkylsulfoxides, among others. However, other polar solvents are also suitable. These polar solvents and mixtures thereof are typically used to solubilize polymers where R'" is a carbohydrate or polyhydroxylated hydrocarbon, ethers and esters thereof, or combinations thereof.

For polymers where R' is hydrogen, alkyl, alkenyl and alkynyl, aryl and cycloalkyl, arylalkyl, alkenyl and alkynyl, alkyl, alkenyl and alkynyl cycloalkyl, and —OR'", and R'" is alkyl, alkenyl, alkynyl, cycloalkyl, cycloalkenyl and cycloalkynyl and mono-hydroxylated, ether and ester derivatives thereof, and combinations thereof, the solvent is suitably one of intermediate to low polarity or a mixture thereof. The dielectric constant of the solvent may be equal or less than about 20, and more preferably less than about 15. Suitable solvents of intermediate and low polarity are chloroform, tetrahydrofuran, xylene, dichlorobenzene, chlorobenzene, toluene, mixtures thereof, and mixtures thereof with ($C_1$–$C_6$)alcohols. However, other solvents of medium or low polarity may also be utilized.

The polymers of the invention may be prepared by methods known in the art (Montes, M. S., et al., J. Chem. Soc. Perkin Transactions I, pp. 461 (1975); U.S. Pat. No. 5,189,136 to Wudl, F., et al.). For example, the polymers of chemical formula (I) and related poly(phenylene vinylene) polymer compounds can be produced by the method shown in Scheme 1 below.

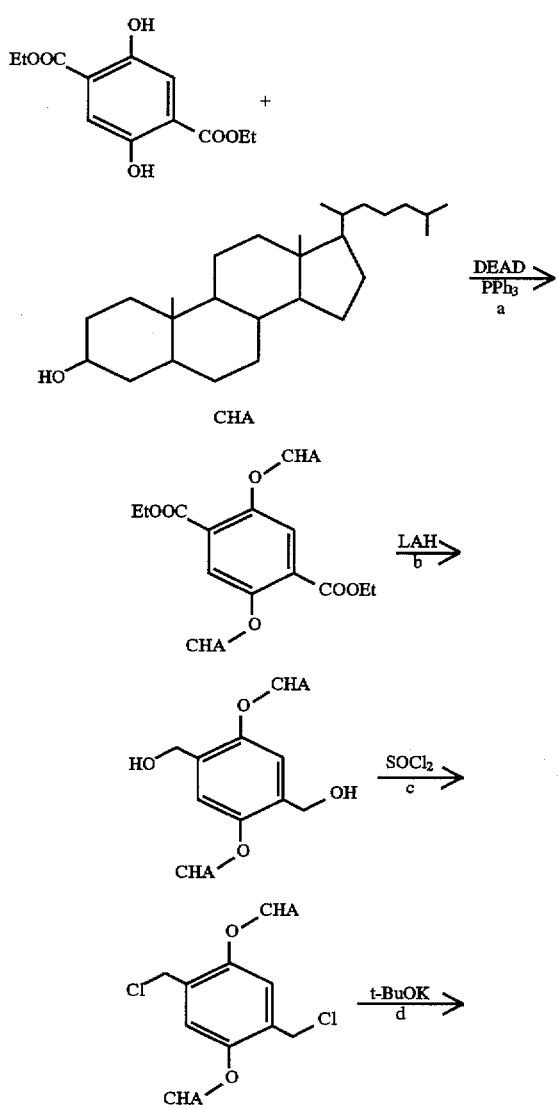

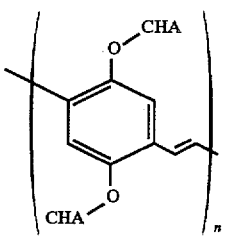

In step "a" of Scheme 1 shown above for a homo-polymer a 2,5-dihydroxy derivative of a dialkyl terephthalate, e.g., di-ethyl terephthalate, is reacted with a hydroxyl derivative of the R'" substituent represented by the steroid cholestanol (CHA) in the presence of a strong electrophilic agent, e.g., di-ethylazodicarboxylate (DEAD) and a nucleophile such as triphenyl phosphine (PPh$_3$) in a solvent or solvent mixture, e.g., tetrahydrofuran (THF), to produce the ether derivative of the dihydroxy terephthalate and the R'" substituent. This is exemplified in Example 1. For the preparation of co-polymers a similar step may be utilized to prepare the R', R"-derivatized monomers separately.

In step "b" of Scheme 1, the carboxy groups of the di-terephthalate di- ether derivative are reduced to hydroxymethyl groups with a strong reducing agent such as lithium aluminum hydride (LAH) as is known in the art and exemplified in Example 2.

In step "c" of Scheme 1, the thus obtained hydroxyl groups are substituted by halogen groups such as chlorine by, e.g., a chlorination reaction with, e.g., thionyl chloride, to produce the di-halogenated derivative thereof (1,4-bis (chloromethyl)-2,5-bis(cholestanoxy) benzene) as exemplified in Example 3.

The polymerization of one or more monomer types may be conducted by mixing the desired monomers in the desired proportion in the presence of a polymerization reagent and a suitable solvent to produce the desired polymer product. This is exemplified in step "d" of the Scheme 1 shown above and in Example 4 for homo-poly[2,5-bis(cholestanoxy)p-phenylene vinylene]. A similar procedure may be employed for the preparation of all other polymers described herein by utilizing the desired R'"-OH compound(s). Another example is poly[2,5-bis(2'-ethyl-hexyloxy)-p-phenylene vinylene] (EH-PPV) and the asymmetric polymers described herein.

Briefly, the general conditions for the preparation of the present polymers are as follows. Step "a" of Scheme 1 leading to the formation of the ether bridge between the hydroxyl group attached to the phenylene ring and the R'" substituent may be conducted at a temperature about 15° to 25° C. and the proportion of the di-alkyl terephthalate to the hydroxyl derivatives of the R'" substituent compound may be broad. Typically, these compounds react in a proportion of about 1:2, but other amounts may be utilized. The reaction may be conducted at various pressures, but preferable is atmospheric pressure. The reaction is preferably conducted with stirring for better mixing of the reactants and may be allowed to proceed for a period of about 3 hrs. to 10 days, and in some instances even longer. The thus obtained product may be solvent extracted, washed and dried as is known in the art. Further purification of the product may be attained, e.g., by column chromatography, and dissolving and precipitating one or more times.

In step "b" of Scheme 1 the carboxyl groups of the terephthalate may be reduced to hydroxy methyl groups with a strong reducing agent in a proportion to the terephthalate of about 1:1 to 10:1, and preferably about 3:1, at a temperature of about −5° to +5° C. for a period of about 15 min. to 5 hrs. A preferred temperature is below 4° C., and the reaction mixture may then be allowed to stand, e.g., at room temperature, for about 1 to 24 hrs. and longer, and then stopped by addition of alkali. The product may then be further purified by filtration, solvent extraction and washing, and then dried.

Step "c" of Scheme 1 may be conducted at the temperature about −30° to −90° C., and preferably below −50° C., and the bis-hydroxy methyl phenylene derivatives and the halogenating agent may be added in a proportion of about 3:1 to 1:1 (mol:1), and the reaction allowed to proceed for a period of about 10 min. to 5 hrs. and then brought up to room temperature and allowed to stand for a period of about 1 to 48 hrs. or until a precipitate forms. The halogenated product may be further purified by evaporation, solvent extraction and washing, and then dried.

Step "d" of Scheme 1 may be conducted at the temperature about −5° to +5° C., and preferably below 4° C. The polymerization of step "d" may be conducted by adding one or more monomer types in the desired proportion in the presence of a polymerization reagent such as potassium ter-butoxide and a solvent and allowing the reaction to proceed for a period of about 30 min. to 48 hrs., preferably in excess of 20 hrs., at this temperature until the viscous reaction mixture becomes a gel. The resulting gel may be poured into a two phase solvent mixture and the insoluble polymer extracted from the aqueous phase. The polymer remaining in the organic phase may be extracted with a different solvent and then washed with water, further extracted with a different solvent and then with an aqueous phase and dried.

These polymers were shown to be soluble at room temperature in a number of common solvents, such as chloroform, tetahydrofuran, di-chlorobenzene and xylene, among others, in an amount of about 0.01 to 20%, regardless of molecular weight.

The absorption maximum obtained for these polymers is in general shifted to the red when compared to that of MEH-PPV. The polymers show electroluminescence and emit brilliant visible light of different wavelengths than MEH-PPV.

An electrically conductive material may be formed from at least one of the polymers of this invention by methods known in the art (Handbook of Conducting Polymers, Vols. I and II, Skotheim, T. A., ed., Marcel Dekker, Inc., N.Y., N.Y. (1986)).

In addition to the above, a film may be cast from either the homo-polymer or the co-polymer of this invention. The film may be cast from a powder of the polymer described herein by methods known in the art (see, Handbook of Conducting Polymers (1986), supra). Typically, the films produced by the polymer of this invention have a thickness of about 1 μ to 1 mm. However, thinner or thicker films are also contemplated.

Light emitting diodes (LEDs) may be manufactured utilizing as their active luminescent semiconductive layer a film cast from the polymer of this invention as described below. Typically, the present polymers provide an excellent semiconductive layer for a diode further comprising a metallic contact and an electron transport layer. The diodes manufactured utilizing the polymer of the invention may be utilized in a high yield method of transducing electric energy into visible light. The diodes of the present invention have a high quantum efficiency of the order of about 0.2 to 0.4% and even higher with aluminum, indium and calcium as electron injecting contacts, the first two being air stable.

In addition, the film of the invention may be formed on a surface such as a polymer film, quartz, glass, or indium-tin oxide coated glass (ITO) surface, among others. The film may be formed on a surface with excellent reproducibility, for instance, by spin-casting from a solvent solution. The thus produced films are homogeneous and dense films of uniform thickness.

The polymer of this invention is also excellent for the preparation of conductive fibers, molded articles and electrostatic and electromagnetic shields. The fibers may be manufactured by methods known in the art (see, Handbook of Conducting Polymers (1986), supra).

Also provided herein is a method for sensing the presence of dopant within a designated area, that comprises exposing an amount of a dopant present within a designated area to at least one poly(phenylene vinylene) polymer of this invention for a period of time effective to allow the uptake of the dopant to be sensed by the polymer; and measuring the conductivity of the polymer and correlating the conductivity to the amount of dopant present within the designated area.

Dopants suitably sensed by the present polymer include halogens, $BF_3$, $AsF_3$, $FeCl_3$, and the like (see, Handbook of Conducting Polymers (1986), supra). Halogens that can be sensed by the present method are preferably iodine, bromide and chlorine.

The polymer of the invention has a fast doping and de-doping rate. Doping may be attained, for instance, by exposing a film formed from the polymer of the invention to an atmosphere of halogen vapor. During the period of exposure or doping, the conductivity of the polymer increases. Doping with iron chloride also increases the conductivity of these polymers. The rate of undoping is fast even at room temperature. This rate may be increased by heating the polymer to a temperature of about 25° to 300° C. and even higher, for instance, in the case of halogen dopants, and expelling the halogen from the film and conditioning the polymer for reuse.

The conductivity of the polymer measured for a particular dopant vapor atmosphere may be correlated with a control point value or a curve with points previously determined under similar conditions for the same dopant.

In the case of LEDs manufactured with the polymer of the invention, e.g., BCHA-PPV, these diodes may be turned-on at about 8V and have a light emission wavelength of about 570 nm at room temperature with external quantum efficiencies of about 0.2 to 0.4% photons per electron, and in some instances in excess thereof. The present polymers are soluble, in conjugated form, at room temperature, in common organic solvents due to the bulky side groups. The manufacture of films and devices is therefore highly simplified because the polymers can be spin-cast from a stable solution at room temperature.

These polymers are excellent for use in LEDs for light emission in technical devices. A suitable LED structure using the polymer of the invention may comprise a semiconductive polymer, an electron transport layer (ETL) and a metallic contact. ETLs are generally believed to serve at least the following three functions.

1) To block holes at the interface between the semiconductive polymer layer and the ETL and enhance the probability of radiative recombination with an electron in the luminescent polymer.

2) Since the holes are blocked at the interface, the electric field in the ETL can be increased to improve the electron injection from the negative electrode.

3) The ETL separates the metallic contact from the active luminescent polymer layer to reduce the probability of luminescence quenching of excitons (created from electrons and holes at the interface between the semiconductive polymer layer and the ETL) by the metallic electron injecting contact.

The first two effects tend to reduce the imbalance between electron injection and hole injection. The third effect is quite general, since the proximity of a metal contact tends to enhance non-radiative recombination. The relative importance of the three depends on the details of the metal-polymer contact.

In the present invention, an ETL may be placed between the semiconductive polymer and the metallic contact to improve the efficiency of the yellow light-emitting diodes manufactured with the polymer of the invention as the electroluminescent layer and with a metal, e.g., aluminum and indium, as the electron injecting electrodes.

Such an LED structure generally consists of a metal, e.g., calcium, rectifying contact on the front surface of the semiconductive film which has been spin-cast onto a glass substrate partially coated with, e.g., a layer of indium/tin-oxide (ITO), the hole-injecting contact. The luminescent thin film layer may be prepared, for instance, by spin-casting from an organic solvent solution containing about 0.01% to 50 wt %, more preferably about 0.05 to 25 wt %, and still more preferably about 0.1 to 10 wt % of the polymer. The resulting films have uniform surfaces with a thickness in the range from about 1000 to 3000 Å, depending on the concentration of the solution, spin rate, etc. The electron-injecting metal contacts may be deposited on top of the polymer layer by vacuum evaporation at pressures below about $4 \times 10^{-7}$ Torr, yielding active areas of less than about 0.1 cm to extremely large surfaces, which may be utilized for displays. All processing steps are preferably carried out in a nitrogen atmosphere. An indium solder may be used to connect the wires to the electrodes.

Improved efficiencies and lower turn-on voltages are attained with the indium and aluminum electrodes, which probably result primarily from a combination of the first two effects listed above.

LEDs comprising the polymer of the invention and with indium and aluminum instead of calcium attain superior quantum efficiencies than LEDs utilizing polymers and electrodes of the prior art.

Having now generally described this invention, the same will be better understood by reference to certain specific examples, which are included herein for purposes of illustration only and are not intended to be limiting of the invention or any embodiment thereof, unless so specified.

EXAMPLES

An abbreviated synthesis method for the polymers follows the following Scheme 2 and is exemplified in Examples 1 to 3 for MEH-PPV.

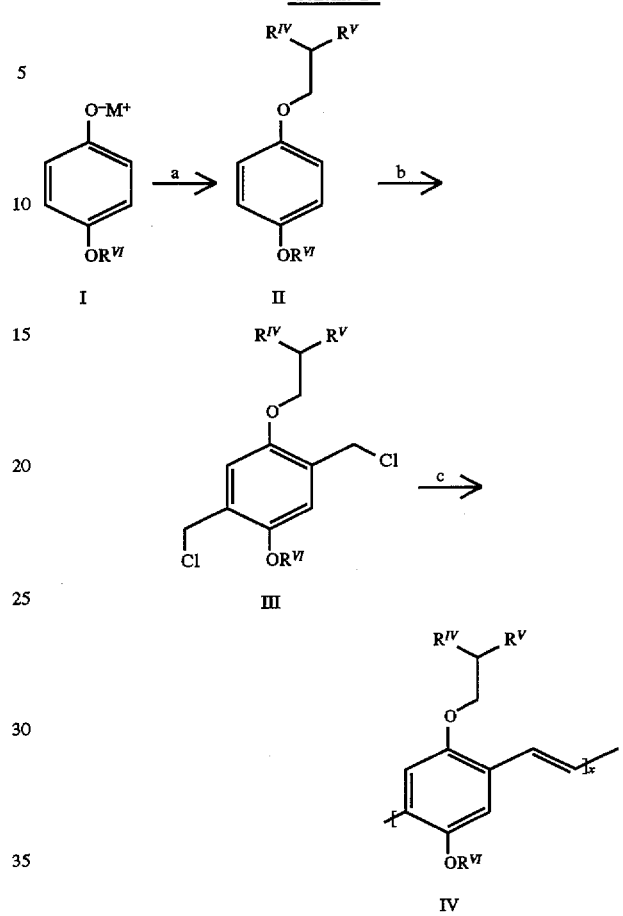

wherein
$R^{IV}$ is $(C_3-C_{10})$alkyl;
$R^V$ is different from $R^{IV}$ and is any alkyl or benzyl which may be further substituted with hydroxyl, halogen, amine or $(C_1-C_{10})$ether or ester;
$R^{VI}$ is $(C_1-C_{10})$alkyl or diethyl $R^{IV} R^V$; and x>20.

Example 1

Preparation of 1-Methoxy-4-(2-Ethyl-Hexyloxy) Benzene (Step "a" of Scheme 2)

A solution of 24.8 g (0.2 mole) of 4-methoxy phenol in 150 ml dry methanol was mixed under nitrogen with 1.5M solution of sodium methoxide (1.1 equivalent) and refluxed for 20 min. After cooling the reaction mixture to room temperature, a solution of 2-ethylbromohexane (42.5 ml, 1.1 equivalent) in 150 ml methanol was added dropwise.

After refluxing for 16 hrs., the brownish solution turned light yellow. The methanol was evaporated and the remaining mixture of the white solid and yellow oil was combined with 200 ml of ether, washed several times with 10% aqueous sodium hydroxide and with $H_2O$ and dried over $MgSO_4$. After the solvent was evaporated, 40 g (85%) of yellow oil were obtained.

The crude material was distilled under vacuum (2.2 mm Hg, B.P: 148° to 149° C.) to give a clear, viscous liquid.

The analysis of the liquid gave the following results.

$^1$H NMR (CDCl$_3$) delta 6.98 (4H, s, aromatics), 3.8 (5H, t,)—OCH$_2$, —O—CH$_3$), 0.7–1.7 (15H, m, C$_7$H$_{15}$). IR (NaCl plate): 750, 790, 825, 925, 1045, 1105, 1180, 1235, 1290, 1385, 1445, 1470, 1510, 1595, 1615, 1850, 2030, 2870, 2920, 2960, 3040. Anal. Calc. for $C_{15}H_{24}O_2$; C:76.23; H:10.23; O:13.54. Found: C:76.38; H:10.21; O:13.45.

Example 2

Preparation of 2,5-bis(Chloromethyl)-1-Methoxy-4-(2-Ethyl-Hexyloxy) Benzene (Step "b" of Scheme 2)

A solution of 4.9 g (20.7 mmoles) of the compound prepared in Example 1 above was prepared by dissolving in 100 ml p-dioxane, and cooled down to 0°–5° C., and 18 ml of concentrated HCl, and 10 ml of 37% aqueous formalin solution were added.

Anhydrous HCl was bubbled through the solution for 30 mins. while the reaction mixture warmed up to room temperature. The mixture was then stirred for 1.5 to 2 hrs. Another 10 ml of formalin solution were added and HCl gas bubbled for 5 to 10 mins. at 0° to 5° C. After stirring at room temperature for 1 hr., this step was repeated 2 to 3 times, and the reaction mixture stirred at room temperature for 16 hrs. At the end of this period, the reaction mixture was refluxed for 3 to 4 hrs.

After cooling and removing the solvents, an off-white "greasy" solid was obtained. The material was dissolved in a minimum amount of warm hexanes and precipitated by adding methanol until the solution became cloudy. After cooling, filtering and washing with cold methanol, 3.4 g (52%) white crystalline material (MP 52° to 54° C.) were obtained.

The analysis produced the following results.

$^1$H NMR (CDCl$_3$) delta 6.98 (2H, s, aromatics), 4.65 (4H, s, CH$_2$—Cl), 3.86 (5H, t, —O—CH$_3$, —OCH$_2$), 0.9–1.5 (15H, m, C$_7$H$_{15}$). IR (KBr): 610, 700, 740, 875, 915, 1045, 1140, 1185, 1230, 1265, 1320, 1420, 1470, 1520, 1620, 1730, 2880, 2930, 2960, 3050. Anal. Calc. for $C_{17}H_{26}O_2Cl_2$; C:61.26; H:7.86; O:9.60; Cl:21.27. Found: C:61.31; H:7.74; O:9.72; Cl:21.39.

Example 3

Preparation of poly(1-Methoxy-4-(2-Ethyl-Hexyloxy-2,5-Phenylene Vinylene), MEH-PPV (Step "c" of Scheme 2)

A solution of 1.0 g (3 mmol) of 2,5-bis(chloromethyl)-1-methoxy-4-(2-ethylhexyloxy) benzene prepared in Example 2 above in 20 ml of anhydrous THF was prepared. To this was added dropwise a solution of 2.12 g (18 mmol) of 95% potassium tert-butoxide in 80 ml of anhydrous THF at room temperature and the reaction mixture was stirred at ambient temperature for 24 hrs. At the end of this time the reaction mixture was poured into 500 ml of methanol with stirring. The resulting red precipitate was washed with distilled water, reprecipitated from THF/methanol and dried under vacuum to afford 0.35 g (45% yield).

The analysis of the product produced the following results.

UV (CHCl$_3$): 500. IR (film): 695, 850, 960, 1035, 1200, 1250, 1350, 1410, 1460, 1500, 2840, 2900, 2940, 3040. Anal. Calc. for $C_{17}H_{24}O_2$; C:78.46; H:9.23. Found: C:78.34; H:9.26. M.W. (GPC vs polystyrene): 3×10$^5$.

Inherent viscosity: about 5 dl/g, but time dependent due to tendency to form aggregates. The viscosity was found to increase with standing, particularly in benzene. The resulting solution was therefore thixotropic.

The conjugated polymer is highly colored exhibiting a bright red-orange.

Max. conductivity non-stretched, I$_2$-doped film: 60 S/cm.

Example 4

Polymerization of Precursor Polymer and Conversion to poly(2-Methoxy,5-(2'-Ethyl-Hexyloxy)-p-Phenylene Vinylene) (MEH-PPV) (Step "d" of Scheme 3)

The synthesis by the precursor method is shown in the following Scheme 3 (U.S. Pat. No. 5,189,136, the relevant text of which relating to the synthesis of these polymers is incorporated herein by reference).

Scheme 3

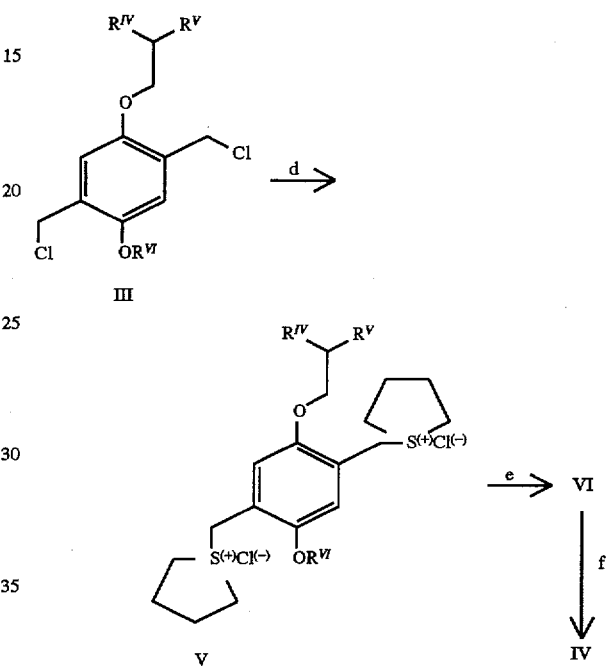

A solution of 200 mg (0.39 mmol) of compound V prepared according to known methods was formed with 1.2 ml dry methanol followed by cooling to 0° C. for 10 mins. A cold degassed solution of 28 mg (1.7 equivalents) sodium hydroxide in 0.7 ml methanol was slowly added to the resulting cooled solution.

After 10 mins., the reaction mixture became yellow and viscous, and was maintained at 0° C. for another 2 to 3 hrs., and then neutralized. A very thick, gum-like material was transferred into a Spectrapore membrane (MW cutoff 12,000 to 14,000), and dialyzed for 3 days in degassed methanol containing 1% water in order to remove low molecular weight products, sodium chloride and reactants.

After drying in vacuo, 70 mg (47%) of "plastic" yellow precursor polymer material were obtained.

The analysis of this product yielded the following results.

UV (CHCl3): 365. IR (film): 740, 805, 870, 1045, 1075, 1100, 1125, 1210, 1270, 1420, 1470, 1510, 2930, 2970, 3020. Soluble in C$_6$H$_5$Cl, C$_6$H$_3$Cl$_3$, CH$_2$Cl$_2$, CHCl$_3$, Et$_2$O, THF and insoluble in MeOH.

Example 5

Conversion of Precursor Polymer to Conjugated poly(2-Methoxy,5-(2'-Ethyl-Hexyloxy)-p-Phenylene Vinylene) (MEH-PPV) (Step "e" of Scheme 3)

The precursor polymer was converted to the conjugated poly(2-methoxy,5-(2'-ethyl-hexyloxy)-p-phenylene vinylene) (MEH-PPV) according to step "e" of Scheme 3 above by heating to reflux (approximately 214° C.) in 1,2,4-trichlorobenzene solvent. The product was identical with the material obtained by the abbreviated synthesis route described in Examples 1 to 3 above.

Example 6

Preparation of poly-2,5-bis(2'-Ethyl-Hexyloxy)-p-Phenylene Vinylene (BEH-PPV) and Conjugated Polymer Thereof This polymer was prepared in a manner similar to MEH-PPV shown in Examples 1 to 5 above.

Example 7

Solubility of the Conjugated poly(2-Methoxy, 5-(2'-Ethyl-Hexyloxy)-p-Phenylene Vinylene) (MEH-PPV) and poly-2, 5-bis(2'-Ethyl-Hexyloxy-p-Phenylene Vinylene (BEH-PPV)

The processing properties of MEH-PPV and BEH-PPV were found to be remarkable. MEH-PPV and BEH-PPV were found to be fully soluble in common organic solvents. For example, solutions of 0.1 wt % MEH-PPV or BEH-PPV, or below, were readily made by dissolving the polymer prepared in Examples 1 to 5 above in xylene at room temperature or at elevated temperatures. Higher concentrations of MEH-PPV, e.g., 2 wt %, could be readily dissolved at elevated temperatures, but resulted in the formation of a gel after cooling down to room temperature while BEH-PPV remained in solution. MEH-PPV and BEH-PPV were found to dissolve equally well in THF, and in chlorinated hydrocarbons and aromatic solvents, such as xylene, toluene, and chlorobenzene. In addition, the solutions were found to be highly colored.

MEH-PPV and BEH-PPV were cast from solution in THF and a variety of other solvents onto glass by drop-casting or by spin casting to produce strong red-orange films. Similarly, films were also spin-cast on surfaces such as quartz, glass, and ITO glass (indium-tin-oxide coated glass). The films made from these polymers appeared to be both smooth and uniform.

Example 8

Doping and Electronic Properties of MEH-PPV and BEH-PPV

MEH-PPV and BEH-PPV are typical of conjugated backbone macromolecules with all of the attendant properties, including doping, and electrochromic and semiconductor behavior. Moreover, both MEH-PPV and BEH-PPV underwent doping at a rapid rate when compared to, for example, polyacetylene or the polythiophenes.

The MEH-PPV and BEH-PPV polymer solutions prepared according to Example 7 above were cast into free standing films, and the films were exposed to iodine vapor. During the period of exposure, the conductivity rose for MEH-PPV from an initial value of $10^{-8}$ S/cm to a value of I S/cm in approximately 15 mins. A similar increase was seen for BEH-PPV.

The undoping rate with iodine was also rapid at room temperature. The maximum (saturation doping) conductivity for non stretched, $I_2$-doped MEH-PPV films was 60 S/cm as measured by the standard four probe method. Doping of MEH-PPV with $FeCl_3$ also resulted in high conductivity, in excess of 10 S/cm. A color change characteristic of conducting polymers was observed upon doping. In the doped conducting form, the MEH-PPV appeared dark black. Similar effects were seen for BEH-PPV.

Example 9

Thermal Properties: High Temperature Stability

Thermogravimetric analysis (TGA) was carried out on MEH-PPV and BEH-PPV. The onset of degradation for MEH-PPV was observed at 340° C. Differential Scanning Calorimetry (DSC) scans were flat below 340° C. A similar effect was observed for BEH-PPV.

Example 10

Production of a Gel Polymer

By following the procedure of the direct synthesis method up to compound III, a new composition of matter, compound IV', can be made which is chemically the same as compound IV but which exhibits different properties. This is accomplished by adding t-BuOK, or an equivalent, in THF all at once to the solution of compound III in THF. The product, compound IV', exhibits different properties from compound IV. Specifically, compound IV' is hard and flexible and insoluble compared with compound IV. The strength of this gel polymer IV' makes it useful in applications where strength is a desirable factor.

Example 11

Preparation of IV' Gel Polymer

This example illustrates the preparation of compound IV' for MEH:PPV, but is not intended to limit the invention. To a solution of 120 ml (0.3M) of t-BuOK in THF were added, all at once, a solution of 2.0 g (6 mmol) of compound III, 2,5-bis (chloromethyl)-1-methoxy-4-(2-ethylhexyloxy) benzene prepared following the procedure of Example 2 above in 20 ml of anhydrous THF.

The reaction mixture was stirred for 16 hrs. and the soluble parts removed by filtration. The gel product of compound IV' or poly(2-methoxy, 5-(2'-ethyl-hexyloxy)-p-phenylene vinylene) (MEH-PPV), was washed alternately with methanol and THF three times, and dried under vacuum.

Yield: 1.1 g (69%). Solid State $^{13}C$ NMR spectrum and IR spectrum identical to soluble polymer. Anal. calc. for $C_{17}H_{24}O_2$; C:78.41; H:9.29. Found: C:78.32; H:9.33.

The above example shows the importance of the order of addition of the reactants. To form the soluble compound IV, t-BuOK or an equivalent in THF must be added to the solution of compound III. When the reverse procedure is followed, that is, the solution of compound III is added to t-BuOK in THF, an insoluble gel of compound IV' is formed which although chemically identical exhibits different properties from compound IV. This is due to the occurrence of cross-linking.

Example 12

Properties of Gel Polymer IV'

The MEH-PPV product of Example 11 was rolled into a film and portions thereof were separately exposed to $I_2$, $Br_2$, and $Cl_2$. The resulting doped films were shown to conduct electricity.

Example 13:

Use of MEH-PPV and BEH-PPV as a Sensor for Halogens

A free standing film prepared according to the procedure of Example 8 was placed in an iodine atmosphere. After a period of exposure of seconds to minutes, the conductivity was measured and shown to correlate with the amount of iodine in the atmosphere.

After measurement of the iodine uptake, the films were heated to expel the iodine for reusing of the films as sensors.

Substantially the same results were obtained using bromine and chlorine as the halogen.

Example 14

Preparation of Diethyl-2,5-bis-(Cholestanoxy) Terephthalate

A solution of 13.1 g (75.0 mmol) diethylazodicarboxylate in 50 ml tetrahydrofuran (THF) to a solution of 25.0 g (64.3 mmol) cholestanol, 8.4 g (33.0 mmol) diethyl-2,5-dihydroxy-terephthalate and 19.4 g triphenyl phosphine in 200 ml of THF with stirring, and allowed to stir for 5 days at room temperature. 250 ml of water and 250 ml of diethyl ether were then added, and the aqueous phase extracted 3 times each with 300 ml of diethyl ether. The combined organic phase was washed once with 200 ml water, 3 times with 100 ml 7% NaOH, 200 ml of water and 200 ml brine, dried over $MgSO_4$ and the solvent evaporated. The product was then separated from the triphenyl phosphine oxide by passage over a short silica gel column (hexanes/ether 3:1). The product was then dissolved in ether and precipitated with methanol.

The analysis yielded the following results.

Yield: 20.1 g (63%) white crystalline product. $^1$H-NMR ($CDCl_3$): d=0.6–2.0 ppm (m, 98 H); 4.35 ppm (q, 4 H); 4.52 ppm (s, 2 H); 7.28 ppm (s, 2 H). IR (KBr): 2920, 2860, 1760, 1710, 1490, 1470, 1415, 1385, 1365, 1340, 1300, 1225, 1205, 1165, 1100, 1030, 995 cm$^{-1}$. MP: 206° C. $[a_D^{20}]$=+13.59 ($CHCl_3$; c 0.243). MS (FAB): 994.3.

Example 15:

Preparation of 1,4-bis(hydroxymethyl-2,5-bis-(Cholestanoxy) Benzene

A solution of 15 g (15.0 mmol) diethyl-2,5-bis-(cholestanoxy)-terephthalate was added at 0° C. to a suspension of 1.4 g (36.9 mmol) lithium aluminum hydride (LAH) in 60 ml THF while stirring. After 2 hrs. at 0° C., the suspension was allowed to reach room temperature and stirred continuously overnight at room temperature. The reaction mixture was then quenched with 10 ml water, and after 3 hrs. with 10 ml 15% NaOH, stirred for 3 hrs., and filtered. The residue was washed three times with 100 ml ether and twice with 80 ml chloroform. The combined organic phase was then washed four times with 150 ml water, once with 100 ml brine and then dried over $MgSO_4$. After evaporating the solvent, 12.1 g of the crude product were dissolved in 100 ml THF and precipitated with 350 ml MeOH and filtered and dried overnight under vacuum.

The analysis yielded the following results.

Yield: 11.5 g (84%) white crystalline product. $^1$H-NMR ($CDCl_3$): d=0.6–2.0ppm (m, 94 H); 4.56 ppm (s, 2 H); 4.69 ppm (s, 4 H); 6.83 ppm (s,2 H). IR (KBr): 3400, 2920, 2860, 1500, 1445, 1420, 1380, 1365, 1205, 1165, 1035, 1000 cm$^{-1}$. MP: 231° C.$[a_D^{20}]$=+30.77 ($CHCl_3$; c 0.089). MS (FAB): 910.5.

Example 16

Preparation of 1,4-bis[Chloromethyl-2,5-bis(Cholestanoxy)] Benzene 0.05 ml pyridine were added to a solution of 4.6 g (5.0 mmol) 1,4-bis(hydroxymethyl)-2,5-bis(cholestanoxy) benzene in 80 ml THF, and the solution was then cooled to –78° C. Thereafter, 2.3 ml thionyl chloride in 30 ml THF were added dropwise. After 1.4 hrs., the cooling bath was removed and the solution stirred overnight at room temperature until a white precipitate formed. The suspension was then evaporated and the residue dissolved in 200 ml chloroform/200 ml water. The organic layer was extracted three times with 120 ml 7% $NaHCO_3$ aqueous solution, twice with 200 ml water and 150 ml brine, and then dried over $MgSO_4$.

The evaporation of the solvent produced 4.3 g (91% yield) TLC-pure 1,4-bischloromethyl-2,5-bis(cholestanoxy) benzene. For the polymerization, this product was recrystallized twice from THF.

The analysis of the produced the following results.

$^1$H-NMR(CDCl3): d=0.65 –2.00 ppm (m, 92 H); 4.54 ppm (s, 2 H); 4.66 ppm (s, 4 H); 6.88 ppm (s, 2 H). IR (KBr): 2930, 2860, 1505, 1450, 1420, 1385, 1370, 1215, 1170, 1040, 1000, 740 cm$^{-1}$. MP: 201° C. $[a_D^{20}]$=+24.16 ($CHCl_3$; c 0.201). MS (FAB): 946.3.

Example 17

Preparation of Poly[2,5-bis-(Cholestanoxy)-PPV](BCHA-PPV)

19 mmol potassium tert-butoxide in 60 ml THF were added to a solution of 3.0 g (3.15 mmol) 1,4-bis [chloromethyl-2,5-bis (cholestanoxy)] benzene in 380 ml THF at 0° C. via a syringe pump in 5 minutes. The colorless solution turned orange and became viscous. After reacting for an additional 18 hrs. at 0° C., the resulting gel was poured into 500 ml chloroform/200 ml water. The organic layer, still containing a large amount of undissolved gel, was extracted three times with 200 ml water. The undissolved gel was then separated from the polymer solution and dissolved in 400 ml chloroform. This solution was then washed with 200 ml water while forming a very viscous polymer solution. The combined organic layers were then diluted with 400 ml chloroform and extracted three times with 400 ml water. After drying with $MgSO_4$, the polymer was precipitated by the slow addition of methanol. The subsequent dissolving and precipitating with small amounts of methanol three times yielded 350 mg of orange polymer.

The analysis of the product showed the following characteristics.

$^1$H-NMR: d=0.4–2.2 ppm (m, 92 H); 4.5 ppm (s, 2 H); 6.5–7.7 ppm (m, 4 H). IR (KBr): 3050, 2920, 2860, 1490, 1470, 1445, 1415, 1380, 1365, 1340, 1245, 1190, 1165, 1035, 1000, 975cm$^{-1}$. $[a_D^{20}]$=+36.66 ($CHCl_3$; C 0.006). Anal. Calc: C:85.04%; H:11.30%. Found: C:85.13%; H: 11.31%.

Example 18

Solubility, Doping and Electronic Properties

BCHA-PPV is a π-conjugated poly(phenylene vinylene) with desirable properties such as fast doping, solubility, electrochromicity and semiconductor behavior, which emits a brilliant yellow light. BCHA-PPV undergoes doping at a rapid rate when compared to, for example, polyacetylene or polythiophenes.

BCHA-PPV was found to be soluble at room temperature in a plurality of organic solvents, e.g., chloroform and xylene, among others.

The BCHA-PPV polymer prepared according to Examples 14 to 17 above could easily be spin-cast from a xylene solution into a free standing film onto a glass substrate partially coated with a layer of indium/tin- oxide (ITO) to form orange-yellow films which are homogeneous and dense, and of uniform in thickness.

When the film was exposed to iodine vapor, a color change on doping, characteristic of conducting polymers, was observed. During the period of exposure, the conductivity rose from its initial value. The undoping rate with iodine was also rapid at room temperature.

Doping with $FeCl_3$ also resulted in a high conductivity polymer.

Example 19

Preparation of LEDs by Spin-Casting of BCHA-PPV Films

The LEDs made had a structure consisting of a metal, e.g., calcium, rectifying contact on the front surface of a BCHA-PPV film, which had been spin-cast onto a glass substrate partially coated with a layer of indium/tin-oxide (ITO), the hole-injecting contact as described by Gustafsson (Gustafsson, Y. et al., Nature 357:477 (1992)).

The luminescent thin film layer was prepared by spin-casting from a 1 wt % BCHA-PPV xylene solution. The resulting orange-yellow BCHA-PPV films had uniform surfaces with a thickness of about 1000 to 3000 Å, which could be varied by varying the concentration of the solution, the spin rate, etc. The electron-injecting calcium contacts were deposited on the top of the BCHA-PPV by vacuum evaporation at a pressure below about $4 \times 10^{-7}$ Torr, yielding active areas of about 0.1 cm². All processing steps were carried out in a nitrogen atmosphere and an indium solder was used to connect the wires to the electrodes.

The spectroscopic measurements were made using a single-grating monochromator (Spex 340S) with a Photometrics CCD camera (Tektronix TK512 CCD) as a detector. The electroluminescence (EL) spectra were recorded while applying a direct current. For the photoluminescence (PL) spectra, the polymer was excited with UV light at 365 nm.

Example 20

Spin-Casting of BCHA-PPV Films and ETLs of PBD in PMMA

BCHA-PPV films were spin-cast onto indium/tin- oxide (ITO) substrates from 1.5 wt % BCHA-PPV xylene solution. The typical film thickness obtained was about 1600 Å. An electron transport layer (ETL) was then spin-cast from 1,4-dioxane solution onto the BCHA-PPV film, the typical thickness of which being about 500 Å.

Metal electrodes (calcium, indium, aluminum) were deposited on top of the ETL by vacuum evaporation at a pressure below about $4 \times 10^{-7}$ Torr, yielding an active area of 0.1 cm². All processing steps were carried out in a nitrogen atmosphere.

ETLs with various concentrations of 2-(4-biphenyl)-5-(4-tert-butylphenyl)-1,3,4-oxadiazole (PBD) were used in order to control the mobility and resistivity of the layer. The most concentrated ETLs were spin-cast from 0.6 wt % PBD and 0.2 wt % polymethylmethacrylate (PMMA) 1,4-dioxane solutions, corresponding to a PBD concentration of 75% in the solid film ETL. At higher concentrations of PBD in PMMA, spin-casting of high quality films was difficult to achieve. Lower concentrations were obtained by utilizing correspondingly lower concentrations of PBD in the solution.

Example 21

Diode Characterization

The onset of the π—π* transition of poly(p-phenylene vinylene) (PPV) occurs at about 500 nm at room temperature. The addition of two methoxy groups to the benzene ring shifts the absorption edge to lower energy by about 100 nm, from 500 nm for PPV to 600 nm for poly(2,5-dimethoxy-p-phenylene vinylene) (DMPPV) (Eckhardt, L., et al., J. Chem. Phys. 91:1303 (1989)). The onset of the π—π* transition of BCHA-PPV is about 55 nm at room temperature or midway between that of DMPPV and that of PPV. The red shift of BCHA-PPV relative to PPV is attributable to the electron-donating cholestanoxy groups attached to the benzene rings of the polymer backbone. The blue shift relative to DMPPV, on the other hand, is most probably the result of a sterically-induced strain in the PPV backbone due to the large cholestanoxy side-groups.

A forward bias current is generally obtained when an ITO electrode is positively biased and a calcium electrode grounded. When the current vs. voltage characteristics were measured from a typical calcium/BCHA-PPV/ITO device, the forward current was found to increase with increasing forward bias voltage while the reverse bias current remained small. The rectification ratio was found to be approximately 550.

When the voltage dependence of emission intensity from a calcium/BCHA-PPV/ITO diode was measured, the light emission first became visible at a bias of just under 8V and a current density of approximately 80 µA/cm². Above 10V, a yellow light emission is visible under normal room light.

When the dependence of the emission intensity on the injected current was assessed as is typical of polymer LED devices, the emission intensity exhibited an approximately linear increase with the injected current. The current-emission efficiency characteristic curve showed that the efficiency increases sharply with increasing injected current at low currents, and then more slowly, tending to become saturated with increasing current. The external quantum efficiency for electroluminescence, defined as photons out per electron injected, was estimated for this device to be about 0.3%. Good reproducibility was found from device to device. The diode emitted yellow light at room temperature.

When the absorption, electroluminescence and photoluminescence spectra of the thin BCHA-PPV film were measured at room temperature in a device, the electroluminescence and photoluminescence spectra of BCHA-PPV were virtually identical, a feature which is quite generally characteristic of polymer LEDs. Thus, the same excitations, presumably neutral bipolaron excitons, are involved in both cases. In the case of photoluminescence, the neutral bipolaron excitons are formed by lattice relaxation following photo-excitation. In the case of electroluminescence, the same species are formed as the intermediate step in the recombination of an electron polaron and a hole polaron.

The emission peak for both the PL and EL spectra of BCHA-PPV was around 570 nm which is about 20 nm blue-shifted with respect to the 590 nm peak of poly(2-methoxy-5-(2'-ethylhexyloxy)-p-phenylene vinylene) (MEH-PPV) (Brown, A. R., et al., Appl. Phys. Lett. 58:1982 (1991)). The small blue shift probably results from steric-induced backbone distortion due to the cholestanoxy groups.

When the emission spectra were plotted for a range of device currents, the EL intensity was seen to increase with increasing current. The wavelength dependence of the emission spectrum did not change as the current through the device was increased.

Example 22

LEDs with Calcium, Aluminum and Indium Electrodes Made with and without ETL

LEDs using calcium electrodes were manufactured with and without the ETL (75% PBD in PMMA) for comparison purposes. The current and light emission were measured for the devices at different applied voltages. Although the ETL was expected to improve the quantum efficiency, as observed for poly(p-phenylene vinylene) (PVV), the efficiency of the LED with the ETL (about 0.3%) was comparable to that of the LED without the ETL. Moreover, the turn-on voltage of calcium device with the ETL was higher than that of a similar device lacking the ETL. Since the total device thickness was increased because of the presence of the 500 Å ETL, this increase in turn-on voltage is probably at least partially due to the resulting lower electric field at any given voltage. When the effect of the PBD concentration in the electron transport layer on the efficiency of the ITO/BCHA-PPV/ETL/calcium device was measured, the efficiency was shown to increase as the concentration of PBD in the ETL increased. More than ten LEDs with calcium electrodes and an ETL (75% PBD in PMMA) were tested with reproducible results. The addition of an electron transport layer barely improved the characteristics of the device with a calcium electron injection electrode.

The current and light emission were measured at different bias voltages for BCHA-PPV LEDs with an aluminum similarly electron injecting contact, with and without the ETL. The current through the device was found to be uniformly higher and the quantum efficiency to be improved by a factor of 5 by addition of the ETL. The maximum quantum efficiency obtained was about 0.25%, almost equivalent to that obtained from the BCHA-PPV LEDs manufactured with calcium electrodes. The electroluminescence spectrum of the ITO/BCHA-PPV/ETL/aluminum device was identical to the photoluminescence spectrum of BCHA-PPV, without any luminescence arising from the ETL.

Similar results were obtained for LEDs with an indium electron injecting electrode. The turn-on voltage of the LED with the ETL was found to be slightly lower than that of the LED without the ETL, and the quantum efficiency to be improved by a factor of about 2, to 0.4%, by addition of the ETL.

The difference in quantum efficiency between the BCHA-PPV devices with calcium (0.3%) and indium (0.2%) was much smaller than that between the MEH-PPV devices with calcium and indium (1% and 0.05%, respectively) (Braun and Heeger (1991), supra).

Example 23

Liquid Crystalline BCHA-PPV Solutions

In high concentration solutions, BCHA-PPV forms a liquid crystalline phase. Polarizing microscope images show that large birefringent regions form in BCHA-PPV solutions in xylenes as the solvent is removed. When the solutions have formed a nearly dry film, a preferred direction can be imparted to the order by mechanical rubbing. These observations show that the addition of the cholestanol side groups lead the polymer to favor a liquid crystalline phase, and that the direction of macromolecular orientation can be controlled by an external stimulus, e.g., mechanical rubbing, etc. The fact that cholesterol is a prototypical mesogen makes it highly possible that it is the driving force for the liquid crystalline order in the BCHA-PPV polymer.

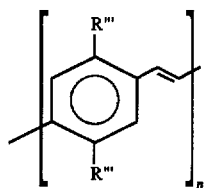

Base structure of PPV and derivatives

R''' = R''' =

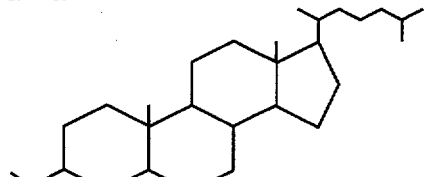

BCHA-PPV side groups

The invention now being fully described, it will be apparent to one of ordinary skill in the art that many changes and modifications can be made thereto without departing from the spirit or scope of the invention as set forth herein.

What is claimed as novel in Letters Patent of the United States is:

1. A poly(phenylene vinylene) polymer having the chemical formula

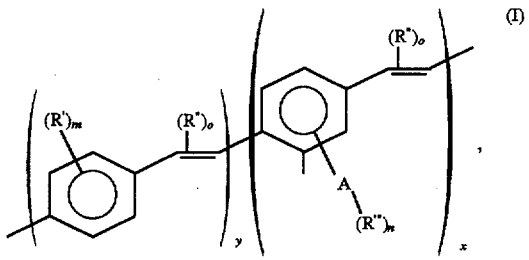

wherein

R' is selected from the group consisting of hydrogen and ($C_1$–$C_{10}$) alkyl;

R'' is selected from the group consisting of hydrogen, and methyl;

R''' is selected from the group consisting of cholesteroxy, cholestanoxy, vitamin $D_3$ ergosteroxy, cedroxy, menthoxy, and farnesoxy;

A is selected from the group consisting of —O—, —S—, —NH—, —CH$_2$— and a single bond;

m is 1 to 4;

n is 1 to 4;

o is 1 to 2;

x is equal to or greater than 1;

y is equal to or greater than 0; and x+y is greater than about 20.

2. Poly[2,5-bis-(cholestanoxy)-phenylene vinylene].

3. The poly(phenylene vinylene) polymer of claim 1, wherein y is 0.

4. The poly(phenylene vinylene) polymer of claim 1, existing in powder form.

5. A poly(phenylene vinylene) polymer for use as a solution to form articles comprising poly(phenylene vinylene) polymer which solution consists essentially of
   at least one poly(phenylene vinylene) polymer of claim 1;
   and at least one non-aqueous organic solvent.

6. The poly(phenylene vinylene) polymer of claim 5, wherein the solution exists in liquid crystalline form.

7. The poly(phenylene vinylene polymer of claim 1 in the form of a film.

8. The poly(phenylene vinylene) polymer of claim 1 shaped in the form of a fiber.

* * * * *